United States Patent
Lin et al.

(10) Patent No.: US 8,846,489 B2
(45) Date of Patent: Sep. 30, 2014

(54) METHOD FOR FORMING TRENCH ISOLATION

(71) Applicant: Anpec Electronics Corporation, Hsin-Chu (TW)

(72) Inventors: Yung-Fa Lin, Hsinchu (TW); Chia-Hao Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/628,051

(22) Filed: Sep. 27, 2012

(65) Prior Publication Data

US 2014/0065795 A1  Mar. 6, 2014

(30) Foreign Application Priority Data

Aug. 28, 2012 (TW) .............................. 101131197 A

(51) Int. Cl.
*H01L 21/76* (2006.01)
(52) U.S. Cl.
USPC .......................................................... 438/424
(58) Field of Classification Search
None
See application file for complete search history.

(56) References Cited

U.S. PATENT DOCUMENTS

| 6,018,174 | A  | * | 1/2000  | Schrems et al. | 257/296 |
| 6,251,750 | B1 | * | 6/2001  | Lee | 438/432 |
| 7,470,588 | B2 | * | 12/2008 | Cho et al. | 438/272 |
| 2006/0089008 | A1 | * | 4/2006 | Hong et al. | 438/778 |
| 2007/0235835 | A1 | | 10/2007 | Ko | |
| 2008/0048186 | A1 | * | 2/2008 | Cheng et al. | 257/48 |
| 2008/0220586 | A1 | * | 9/2008 | Cheng et al. | 438/426 |

FOREIGN PATENT DOCUMENTS

TW   200926353   6/2009

* cited by examiner

*Primary Examiner* — Charles Garber
*Assistant Examiner* — Andre' C Stevenson
(74) *Attorney, Agent, or Firm* — Winston Hsu; Scott Margo

(57) ABSTRACT

A trench isolation method is disclosed. A substrate having thereon a pad layer and a hard mask is provided. An opening is formed in the hard mask. The substrate is etched through the opening to thereby form a first trench. A spacer is formed on a sidewall of the first trench. A second trench is then etched into the substrate through the first trench by using the spacer as an etching hard mask. The substrate within the second trench is then oxidized by using the spacer as an oxidation protection layer, thereby forming an oxide layer that fills the second trench. The spacer is then removed to reveal the sidewall of the first trench. A liner layer is then formed on the revealed sidewall of the first trench. A chemical vapor deposition process is then performed to deposit a dielectric layer that fills the first trench.

7 Claims, 10 Drawing Sheets

METHOD FOR FORMING TRENCH ISOLATION

BACKGROUND OF THE INVENTION

1. Field of the Invention

The present invention relates generally to the field of semiconductor process. More particularly, the present invention relates to a trench isolation process that utilizes spacer process and/or thermal oxidation to achieve void-free trench fill.

2. Description of the Prior Art

In the application of the integrated circuit, the different functional elements are often built on a single chip. In order to ensure that each individual component does not interfere with other components around, the electrical isolation between circuit components is particularly important.

Local oxidation of silicon (LOCOS) is a well known and common isolation method. The LOCOS process is not complex, and has the advantage of low cost. However, with the progress of process capability as well as scaling of elements, the problems such as bird's beak and field oxide thinning have become worse. Therefore, shallow trench isolation (STI) process has been developed.

The STI process includes first etching trench around the active area and then filling the trench with insulating material to isolate the active area. Although the shortcomings of LOCOS can be overcome by the STI process, but it also has the problems of dishing effect and sub-threshold kink effect. Further, with the components miniature, void-free trench fill has become more difficult to achieve.

SUMMARY OF THE INVENTION

Therefore, it is one objective of the present invention to provide an improved trench isolation process, in combination with spacer process and/or thermal oxidation to achieve void-free trench fill, without increasing the process complexity.

According to one embodiment, a trench isolation method is disclosed. A substrate having thereon a pad layer and a hard mask is provided. An opening is formed in the hard mask. The substrate is etched through the opening to thereby form a first trench. A spacer is formed on a sidewall of the first trench. A second trench is then etched into the substrate through the first trench by using the spacer as an etching hard mask. The substrate within the second trench is then oxidized by using the spacer as an oxidation protection layer, thereby forming an oxide layer that fills the second trench. The spacer is then removed to reveal the sidewall of the first trench. A liner layer is then formed on the revealed sidewall of the first trench. A chemical vapor deposition process is then performed to deposit a dielectric layer that fills the first trench.

According to another embodiment, a trench isolation method is disclosed. A substrate having thereon a pad layer and a hard mask layer is provided. At least one opening is then formed in the hard mask layer. A spacer is then formed on a sidewall of the opening. The substrate is etched through the opening to thereby form a trench. A thermal oxidation process is performed, using the spacer as a protection layer, to oxidize the substrate within the trench until the trench is completely filled up with an oxide layer.

According to still another embodiment, a trench isolation method is disclosed. A substrate having thereon a pad layer and a hard mask layer is provided. At least one opening is then formed in the hard mask layer. The substrate is then etched through the opening to a predetermined depth, thereby forming a recess region. A spacer is formed on a sidewall of the opening. The substrate is then etched through the opening and the recess region to thereby form a trench. A thermal oxidation process is performed, using the spacer as a protection layer, to oxidize the substrate within the trench until the trench is completely filled up with an oxide layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
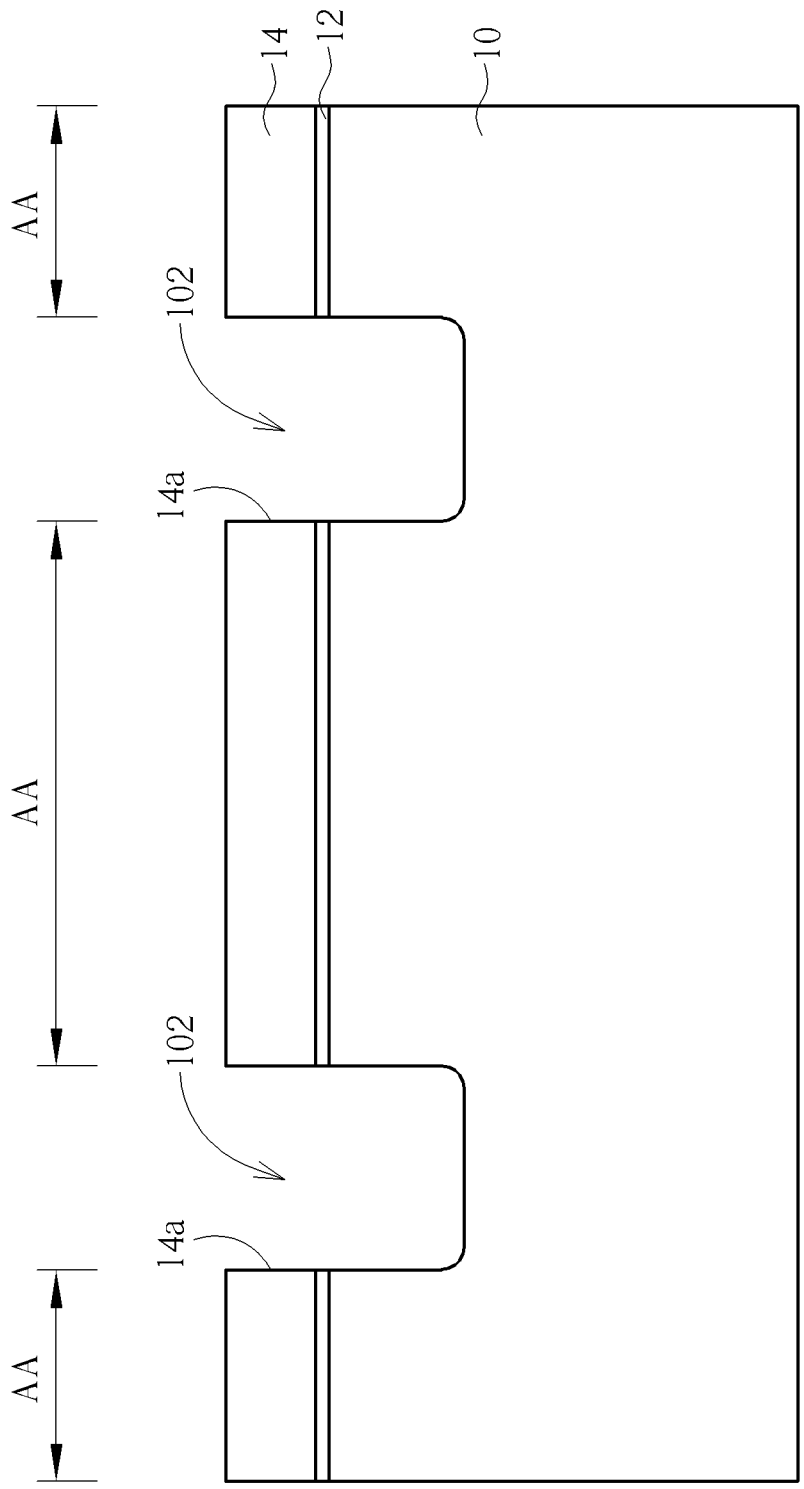
FIGS. 1-4 are schematic, cross-sectional diagrams showing a method for forming trench isolation in accordance with one embodiment of the invention.

FIGS. 1-4 are schematic, cross-sectional diagrams showing a method for forming trench isolation in accordance with one embodiment of the invention. As shown in FIG. 1, a substrate 10 such as a semiconductor substrate is provided. Subsequently, a pad layer 12 and a hard mask layer 14 are formed on a top surface of the substrate 10. For example, the pad layer 12 may be an oxide pad layer, and the hard mask layer 14 may be a silicon nitride hard mask layer. However, it is to be understood that the hard mask layer 14 may be a multi-layer structure, for example, a silicon nitride layer and a silicon oxide layer. A lithographic process and an etching process are performed to form openings 14a in the hard mask layer 14. The patterned hard mask layer 14 substantially defines active areas. Using the hard mask layer 14 as an etching hard mask, the pad layer 12 and the substrate 10 are etched to a first predetermined depth through the openings 14a, thereby forming first trenches 102.

Figure 2:
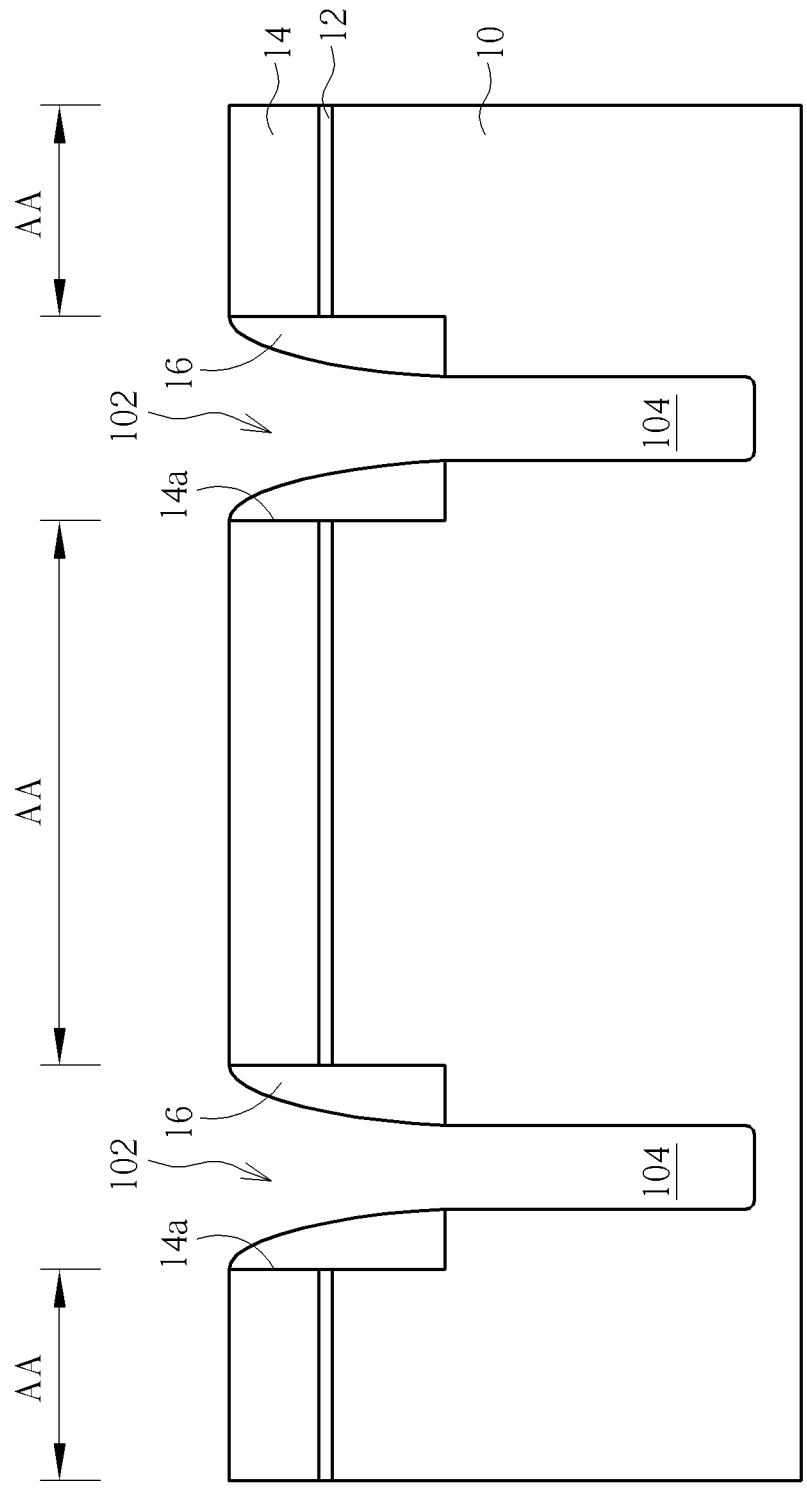

As shown in FIG. 2, a spacer 16 such as silicon nitride spacer is then formed on a sidewall of the first trench 102. For example, the method of forming the spacer 16 may include depositing a conformal silicon nitride layer covering the hard mask layer 16 and the sidewall and bottom of the first trench 102, and then anisotropically etching the silicon nitride layer. Subsequently, after forming the spacer 16, a dry etching process is performed, using the spacer 16 as an etching hard mask, to continue to etch the substrate 10 to a second predetermined depth through the first trench 102, thereby forming a second trench 104 directly under each of the first trenches 102. The trench width of the second trench 104 may be controlled by the width or thickness of the spacer 16.

Figure 3:
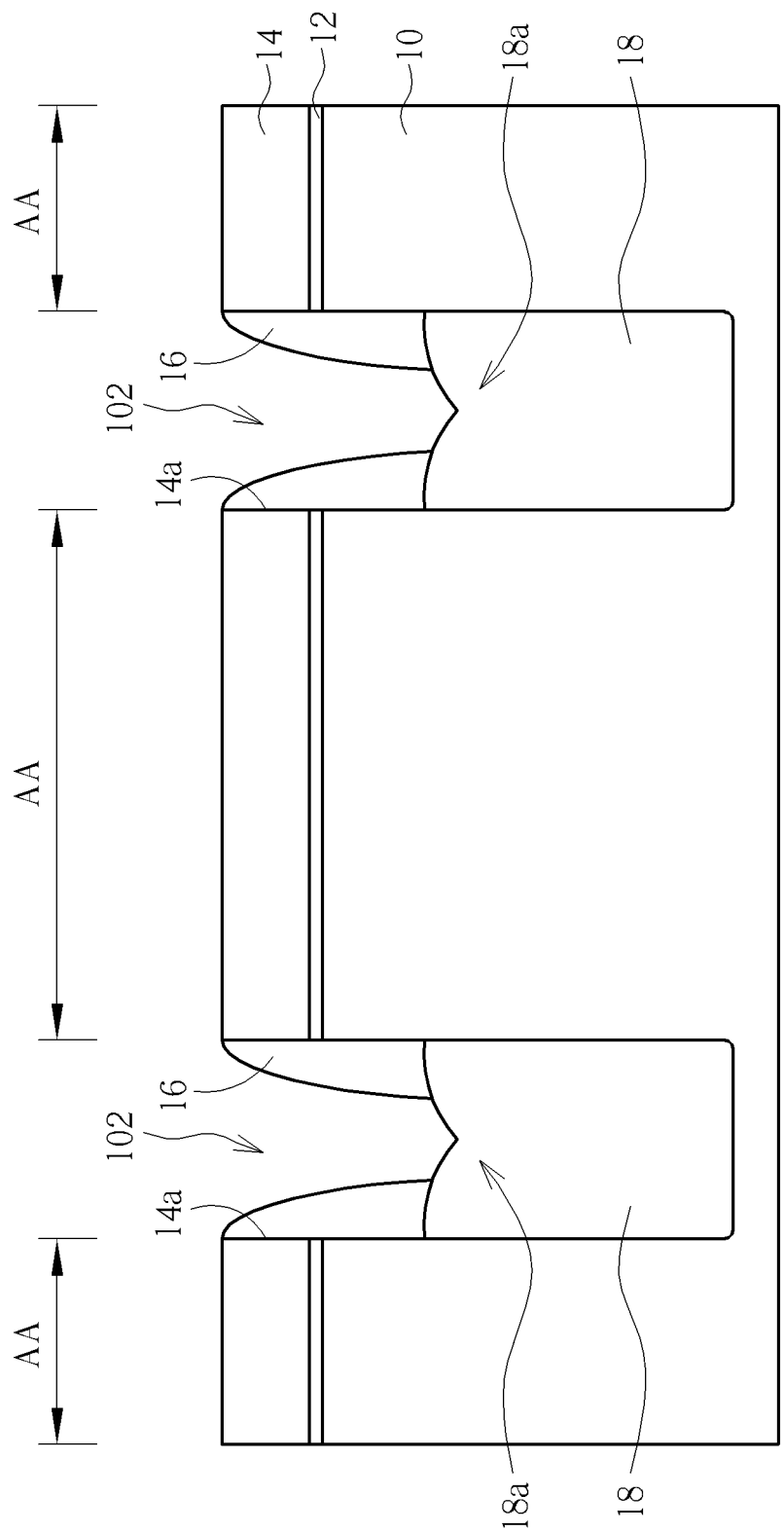

As shown in FIG. 3, a thermal oxidation process is carried out, for example, at a temperature between 800-1200° C., using steam, oxygen, or steam or oxygen containing hydrogen chloride or nitrogen, under process pressure ranging 600-760 torr. At this point, the spacer 16 acts as a protection layer. The substrate 10 within the second trench 104 is oxidized until the second trench 104 is completely filled with an oxide layer 18. As specifically indicated in FIG. 3, a wedge-shaped recess structure 18a is formed on the top surface of the oxide layer 18.

Figure 4:
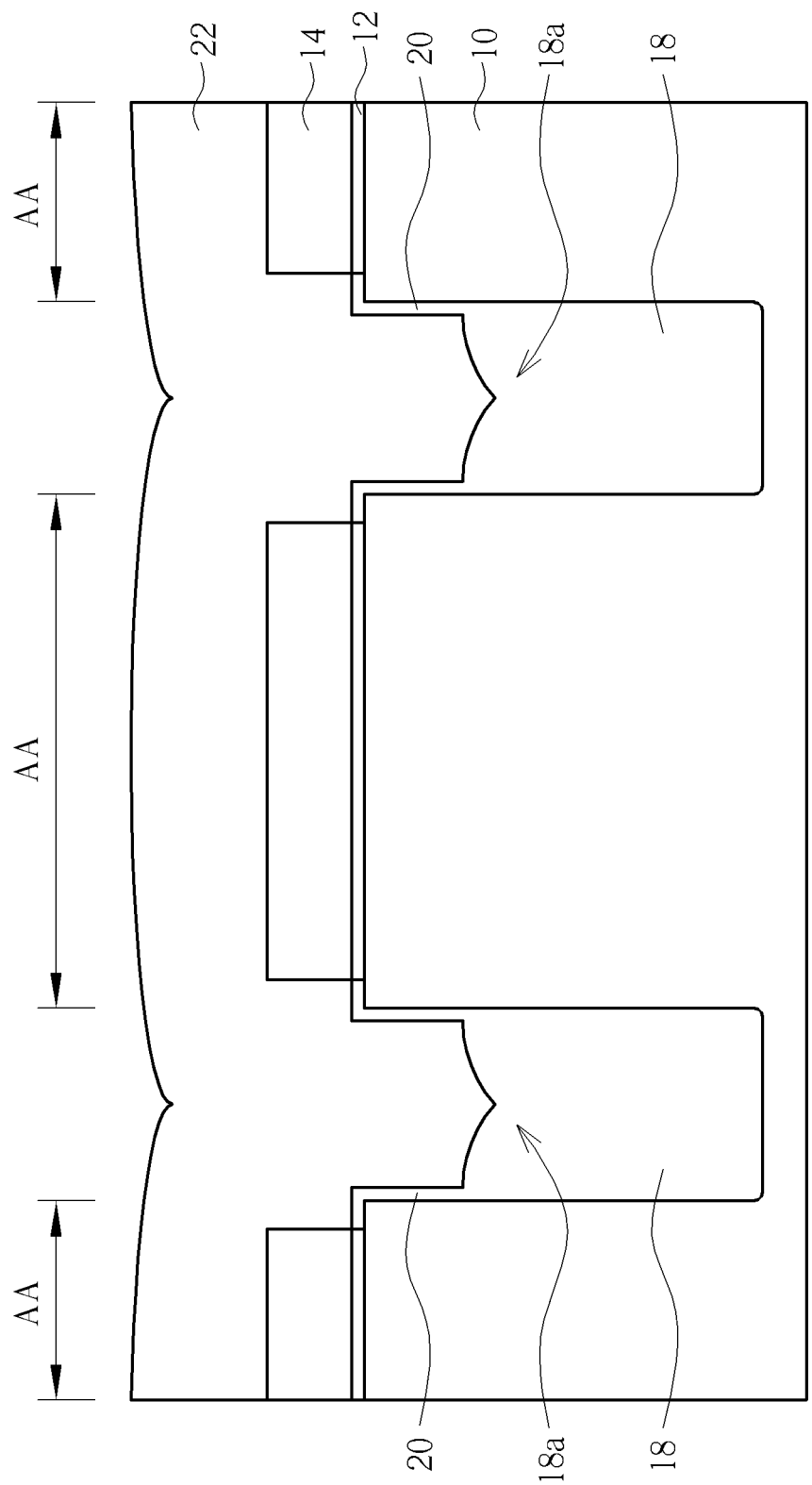

As shown in FIG. 4, the spacer 16 is then removed thereby exposing the sidewall of the first trench 102. An oxidation process is then performed to form an oxide liner layer 20 on the exposed sidewall of the first trench 102. Subsequently, a chemical vapor deposition (CVD) process is performed to deposit a dielectric layer 22 such as a silicon oxide layer in a blanket manner. The dielectric layer 22 fills the first trench 102. Since the second trench 104 is filled with thermally formed oxide layer 18 which reduces the aspect ratio, the subsequent CVD process for trench filling the first trench 102 may have larger process window, and a high-quality, seamless or void-free trench isolation can be achieved.

Figure 5:
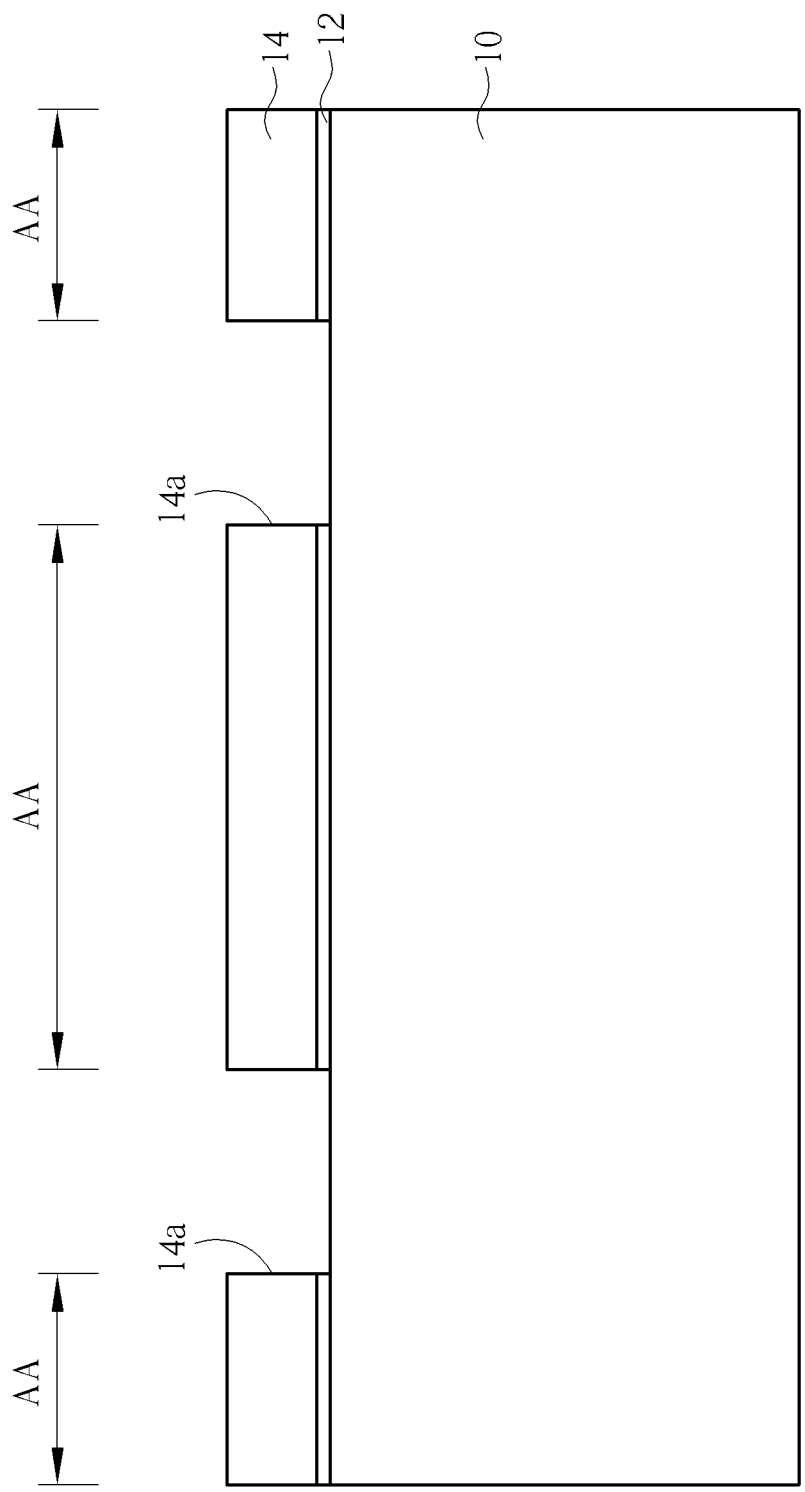
FIGS. 5-7 are schematic, cross-sectional diagrams showing a method for forming trench isolation in accordance with another embodiment of the invention.
Figure 6:
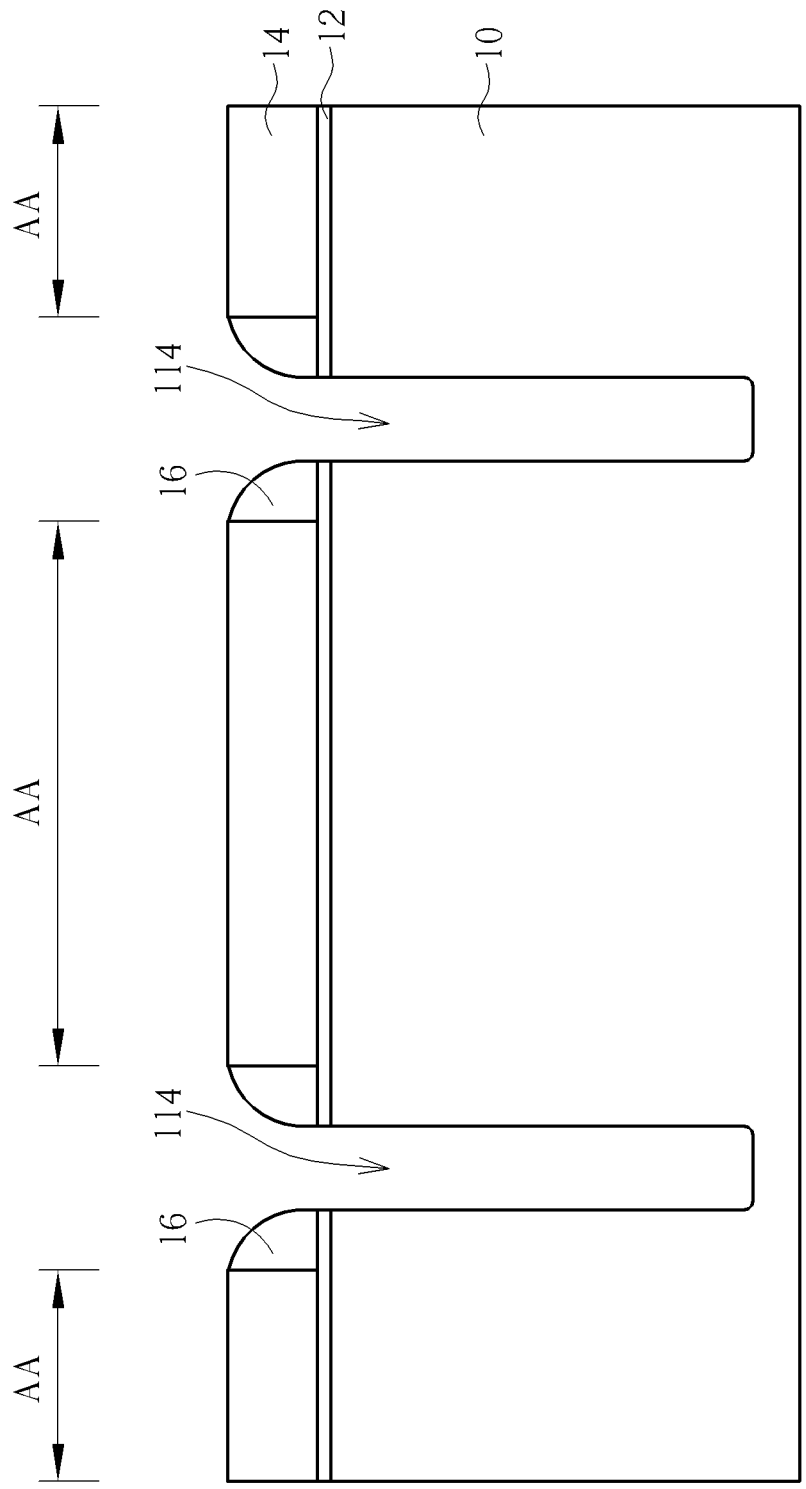
Figure 7:
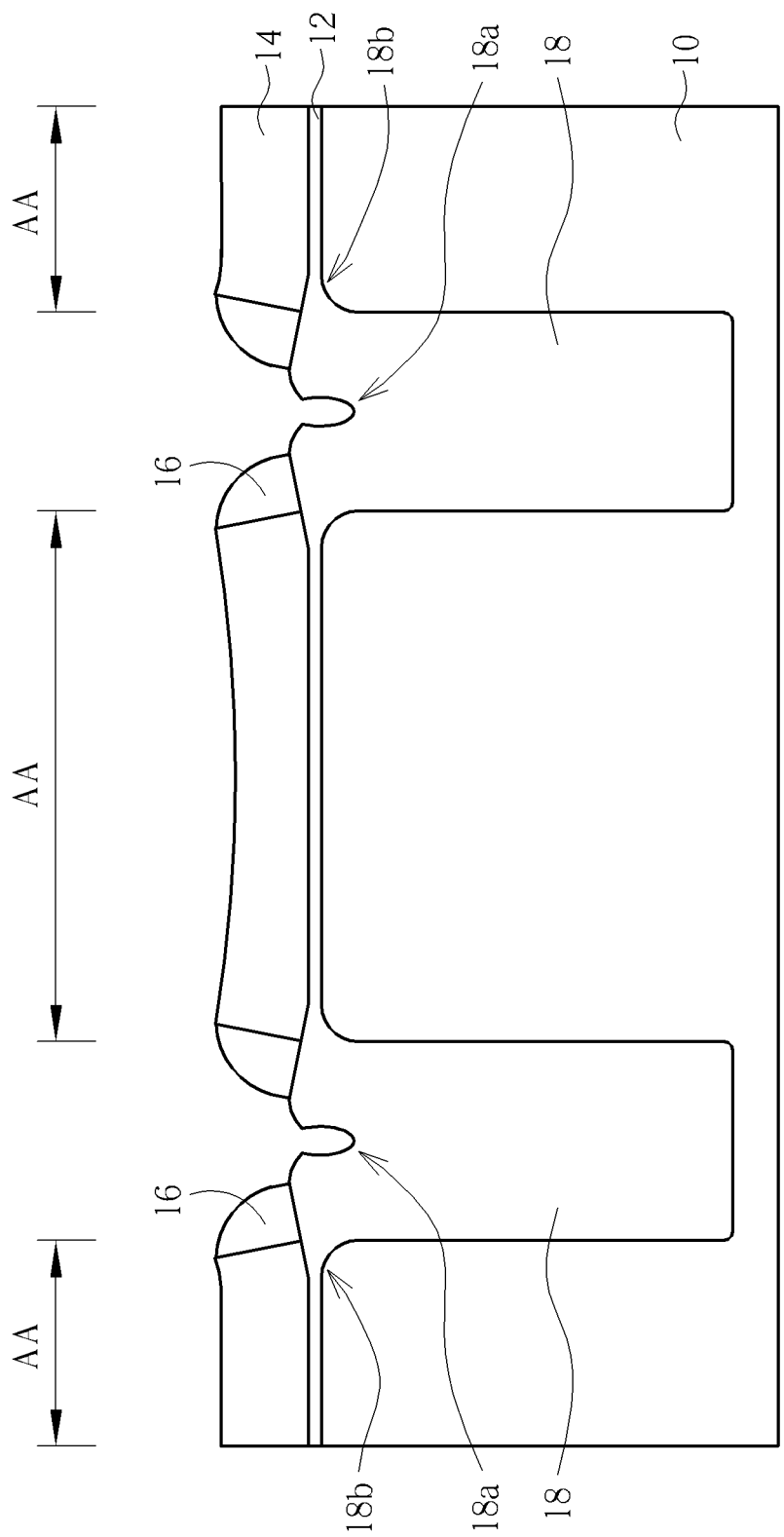

FIGS. 5-7 are schematic, cross-sectional diagrams showing a method for forming trench isolation in accordance with another embodiment of the invention. As shown in FIG. 5, a substrate 10 such as a semiconductor substrate is provided. Subsequently, a pad layer 12 and a hard mask layer 14 are formed on a top surface of the substrate 10. For example, the pad layer 12 may be an oxide pad layer, and the hard mask layer 14 may be a silicon nitride hard mask layer. However, it is to be understood that the hard mask layer 14 may be a multi-layer structure, for example, a silicon nitride layer and a silicon oxide layer. A lithographic process and an etching process are performed to form openings 14a in the hard mask layer 14.

As shown in FIG. 6, a spacer 16 such as silicon nitride spacer is then formed on a sidewall of the opening 14a. For example, the method of forming the spacer 16 may include depositing a conformal silicon nitride layer covering the hard mask layer 16 and the sidewall and bottom of the opening 14a, and then anisotropically etching the silicon nitride layer. Subsequently, after forming the spacer 16, a dry etching process is performed, using the spacer 16 as an etching hard mask, to continue to etch the substrate 10 to a predetermined depth through the opening 14a, thereby forming a trench 114 directly under each of the openings 14a. The trench width of the trench 114 may be controlled by the width or thickness of the spacer 16. For example, the spacer 16 may have a thickness that is smaller than a quarter of a width of the opening 14a.

As shown in FIG. 7, a thermal oxidation process is carried out, for example, at a temperature between 800-1200° C., using steam, oxygen, or steam or oxygen containing hydrogen chloride or nitrogen, under process pressure ranging 600-760 torr. At this point, the spacer 16 acts as a protection layer. The substrate 10 within the second trench 104 is oxidized until the trench 114 is completely filled with an oxide layer 18. As specifically indicated in FIG. 7, a wedge-shaped recess structure 18a is formed on the top surface of the oxide layer 18. At the same time, a slight bird's beak 18b is formed. In this embodiment, by utilizing the thickness of the spacer 16, the width of the isolation trench can be reduced and integration of device can be increased.

Figure 8:
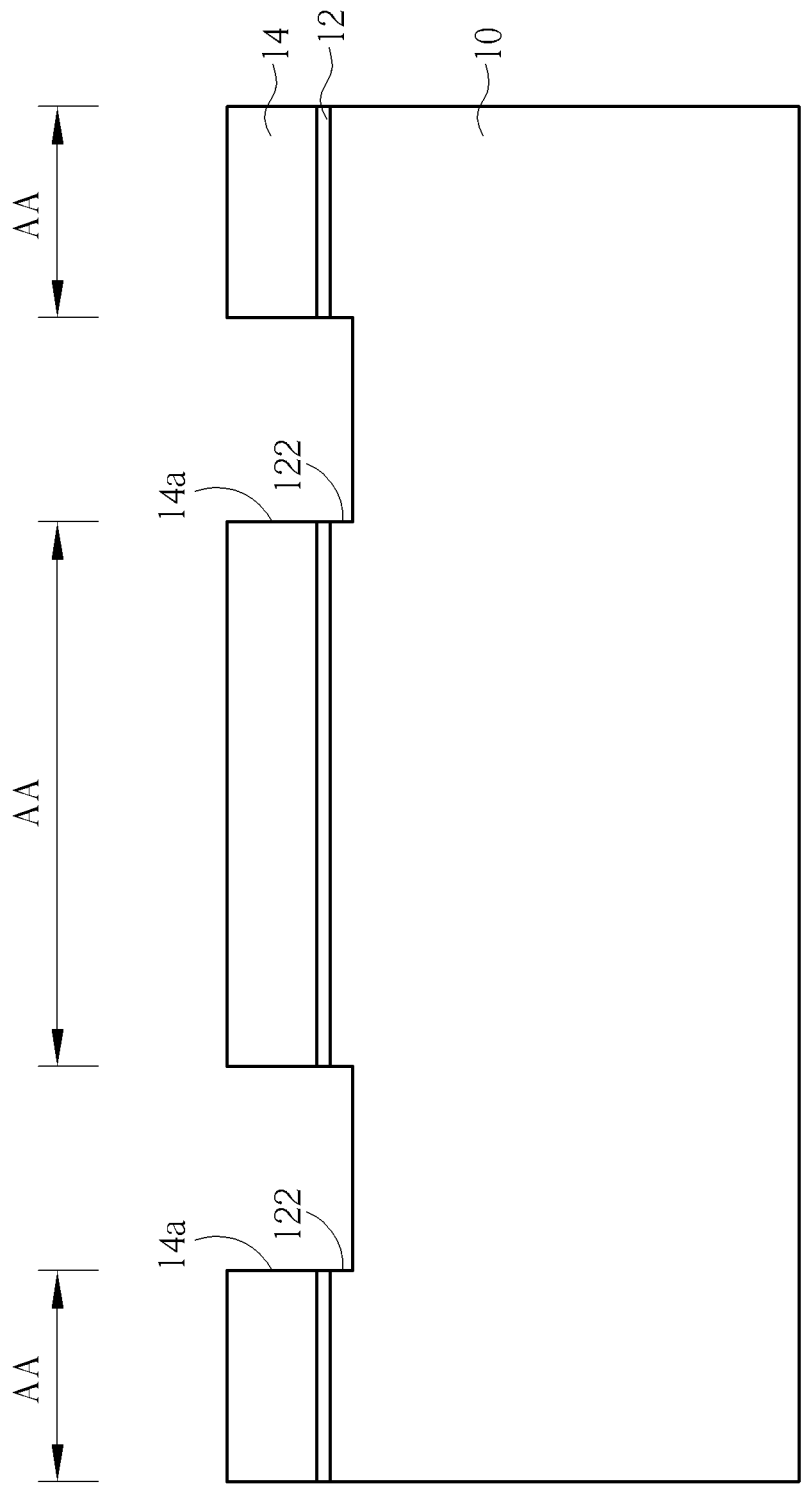
FIGS. 8-10 are schematic, cross-sectional diagrams showing a method for forming trench isolation in accordance with still another embodiment of the invention.
Figure 9:
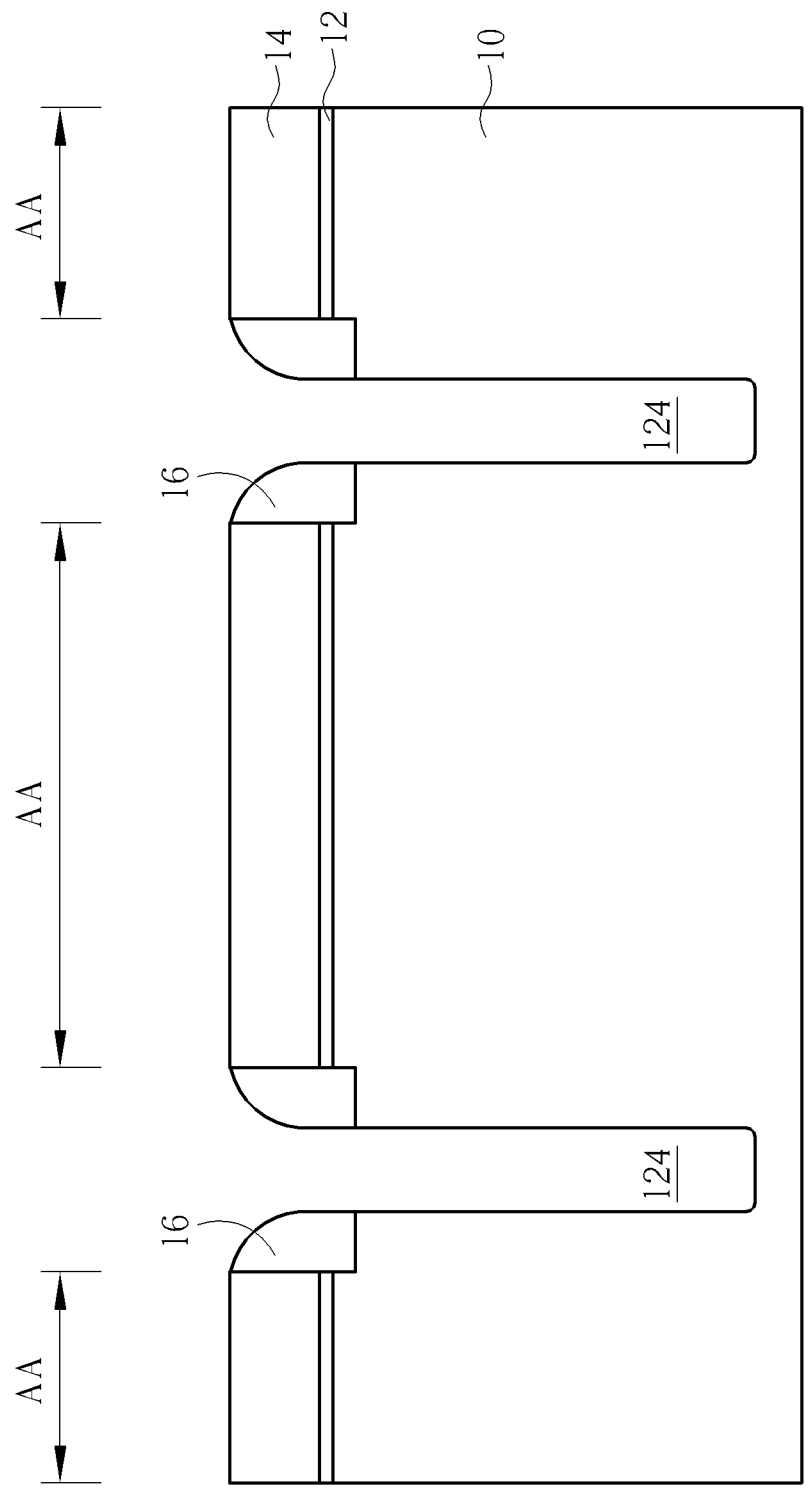
Figure 10:
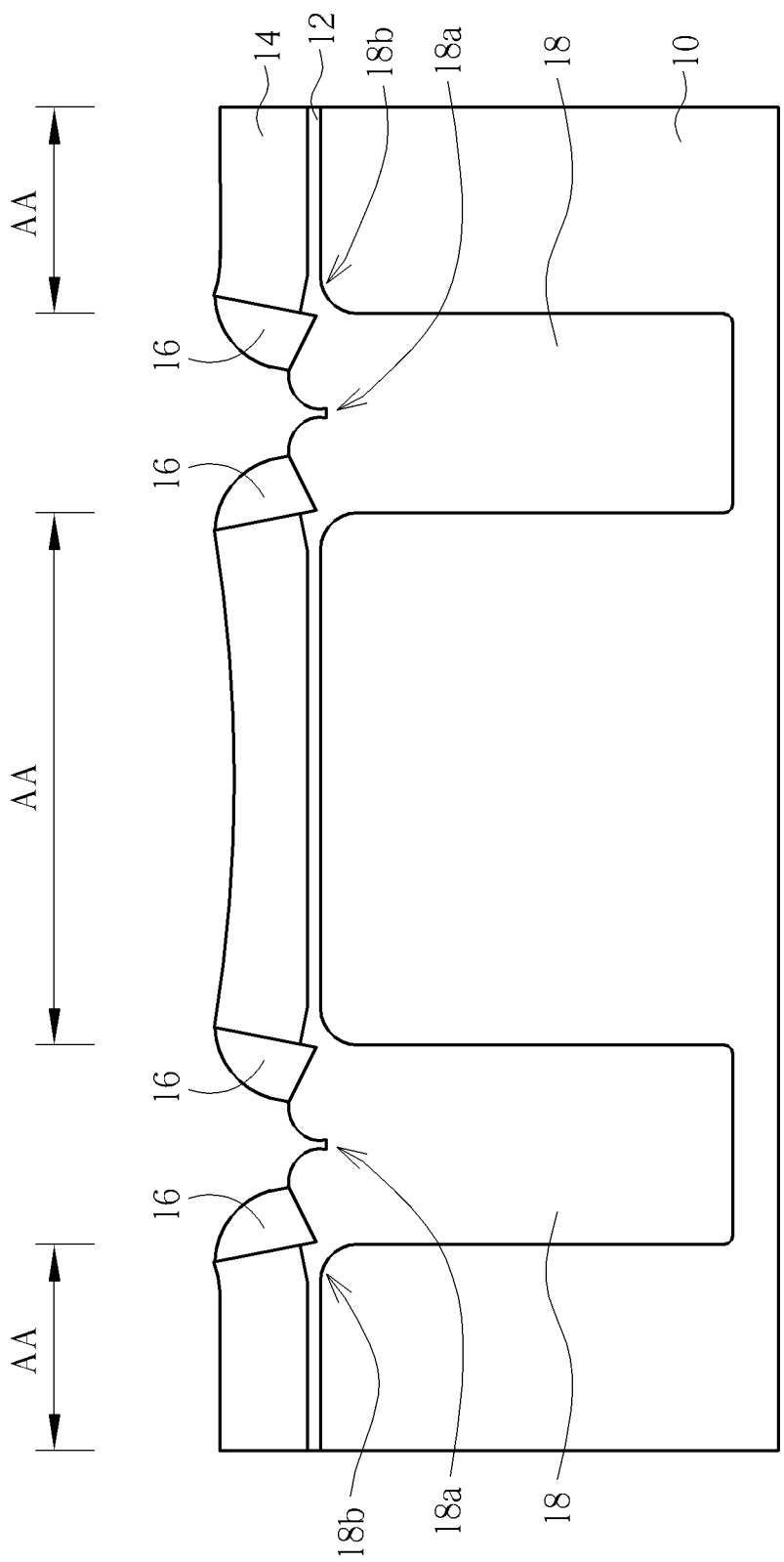

FIGS. 8-10 are schematic, cross-sectional diagrams showing a method for forming trench isolation in accordance with still another embodiment of the invention. As shown in FIG. 8, a substrate 10 such as a semiconductor substrate is provided. Subsequently, a pad layer 12 and a hard mask layer 14 are formed on a top surface of the substrate 10. For example, the pad layer 12 may be an oxide pad layer, and the hard mask layer 14 may be a silicon nitride hard mask layer. However, it is to be understood that the hard mask layer 14 may be a multi-layer structure, for example, a silicon nitride layer and a silicon oxide layer. A lithographic process and an etching process are performed to form openings 14a in the hard mask layer 14. Subsequently, the substrate 10 is etched to a first predetermined depth (smaller than 0.2 micrometers) through the openings 14a, thereby forming a recess region 122.

As shown in FIG. 9, a spacer 16 such as silicon nitride spacer is then formed on a sidewall of the opening 14a. For example, the method of forming the spacer 16 may include depositing a conformal silicon nitride layer covering the hard mask layer 16 and the sidewall and bottom of the opening 14a, and then anisotropically etching the silicon nitride layer. Subsequently, after forming the spacer 16, a dry etching process is performed, using the spacer 16 as an etching hard mask, to continue to etch the substrate 10 to a second predetermined depth through the opening 14a and the recess region 122, thereby forming a trench 124. The trench width of the trench 124 may be controlled by the width or thickness of the spacer 16.

As shown in FIG. 10, a thermal oxidation process is carried out, for example, at a temperature between 800-1200° C., using steam, oxygen, or steam or oxygen containing hydrogen chloride or nitrogen, under process pressure ranging 600-760 torr. At this point, the spacer 16 acts as a protection layer. The substrate 10 within the trench 124 is oxidized until the trench 124 is completely filled with an oxide layer 18. As specifically indicated in FIG. 10, a wedge-shaped recess structure 18a is formed on the top surface of the oxide layer 18. At the same time, a slight bird's beak 18b is formed. In comparison with FIG. 7, due to the recess region 122, the spacer 16 can protect the corners around the active area, therefore the bird's beak 18b in FIG. 10 extends less into the active area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A trench isolation process, comprising:
providing a substrate having thereon a pad layer and a hard mask layer;
forming at least one opening in the hard mask layer;
etching the substrate through the opening to thereby form a first trench;
forming a spacer on a sidewall of the first trench;
etching the substrate through the first trench to thereby form a second trench under the first trench;
performing a thermal oxidation process, using the spacer as a protection layer, to oxidize the substrate within the second trench, thereby forming an oxide layer, wherein the oxide layer is only formed within the second trench and the second trench is completely filled up with the oxide layer;
after forming the oxide layer within the second trench, removing the spacer to thereby expose the sidewall of the first trench;
forming a liner layer on the exposed sidewall of the first trench; and
performing a chemical vapor deposition process to deposit a dielectric layer that fills the first trench.

2. The trench isolation process according to claim 1 wherein the pad layer is a silicon oxide pad layer.

3. The trench isolation process according to claim 1 wherein the spacer is a silicon nitride spacer.

4. The trench isolation process according to claim 1 wherein the thermal oxidation process is performed at a temperature between 800-1200° C., using steam, oxygen, or steam or oxygen containing hydrogen chloride or nitrogen, under process pressure ranging 600-760 torr.

5. The trench isolation process according to claim 1 wherein a trench width of the second trench is controlled by a thickness of the spacer.

6. The trench isolation process according to claim 1 wherein the liner layer is an oxide liner layer.

7. The trench isolation process according to claim 1 wherein the oxide layer has a wedge-shaped recess structure on its surface.

* * * * *